(12) United States Patent
Lee et al.

(10) Patent No.: US 11,825,730 B2
(45) Date of Patent: Nov. 21, 2023

(54) DISPLAY

(71) Applicant: Au Optronics Corporation, Hsinchu (TW)

(72) Inventors: Chih-Tsung Lee, Hsinchu (TW); Chih-Chieh Lin, Hsinchu (TW); Yi-Wei Tsai, Hsinchu (TW); Ko-Chin Chung, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 564 days.

(21) Appl. No.: 16/919,074

(22) Filed: Jul. 1, 2020

(65) Prior Publication Data
US 2021/0029838 A1    Jan. 28, 2021

Related U.S. Application Data

(60) Provisional application No. 62/877,883, filed on Jul. 24, 2019.

(30) Foreign Application Priority Data

Mar. 30, 2020    (TW) .................................. 109110748

(51) Int. Cl.
*H10K 77/10*    (2023.01)
*B32B 3/04*    (2006.01)
(Continued)

(52) U.S. Cl.
CPC .............. *H10K 77/111* (2023.02); *B32B 3/04* (2013.01); *B32B 3/30* (2013.01); *B32B 7/14* (2013.01);
(Continued)

(58) Field of Classification Search
CPC .............. G06F 1/1652; G02F 1/13305; H01L 51/0097; B32B 3/04; B32B 3/30;
(Continued)

(56) References Cited

U.S. PATENT DOCUMENTS 9,793,512 B2    10/2017    Choi et al.
2019/0051858 A1*    2/2019    Tomioka ........... G02F 1/133345

FOREIGN PATENT DOCUMENTS

CN    107065338    8/2017
CN    107221606    9/2017
(Continued)

*Primary Examiner* — Catherine A. Simone
(74) *Attorney, Agent, or Firm* — JCIPRNET

(57) ABSTRACT

A display, including a carrying main body, a flexible carrier film, a double-sided tape, and an adhesive layer, is provided. The flexible carrier film includes a first bonding section and a second bonding section respectively disposed on two opposite sides of the carrying main body, and a bending section connected between the first bonding section and the second bonding section. The flexible carrier film has an inner surface and an outer surface opposite to each other. The inner surface has at least one first groove at the bending section. The flexible carrier film has a display layer thereon. At least a part of the display layer is connected to the outer surface at the second bonding section. The double-sided tape is disposed between the first bonding section and the carrying main body. The adhesive layer is disposed between the inner surface and the carrying main body at the bending section.

18 Claims, 12 Drawing Sheets

(51) Int. Cl.
*B32B 3/30* (2006.01)
*G06F 1/06* (2006.01)
*G02F 1/1333* (2006.01)
*G09F 9/30* (2006.01)
*B32B 7/14* (2006.01)
*G06F 1/16* (2006.01)

(52) U.S. Cl.
CPC ...... *G02F 1/133305* (2013.01); *G06F 1/1652* (2013.01); *G09F 9/301* (2013.01); *B32B 2457/20* (2013.01)

(58) Field of Classification Search
CPC ....... B32B 3/714; B32B 2457/20; B32B 7/14; G09F 9/301
See application file for complete search history.

(56) References Cited

FOREIGN PATENT DOCUMENTS

| | | | | |
|---|---|---|---|---|
| CN | 207516696 | | 6/2018 | |
| CN | 207800055 | | 8/2018 | |
| CN | 208488921 | | 2/2019 | |
| CN | 208488921 U | * | 2/2019 | ............. G09F 9/301 |
| CN | 109782467 | | 5/2019 | |
| CN | 209418505 | | 9/2019 | |

* cited by examiner

DISPLAY

CROSS-REFERENCE TO RELATED APPLICATION

This application claims the priority benefits of U.S. provisional application Ser. No. 62/877,883, filed on Jul. 24, 2019, and Taiwan application serial no. 109110748, filed on Mar. 30, 2020. The entirety of each of the above-mentioned patent applications is hereby incorporated by reference herein and made a part of this specification.

BACKGROUND

Technical Field

The disclosure relates to a display, and particularly to a display including a flexible carrier film.

Description of Related Art

With the development of flat display technology, electronic products using display panels as display interfaces, such as notebook computers, tablet computers, smartphones, etc. have popularized the consumer market for a long time. In order to reduce the device size and to respond to the trend of narrow bezel design, many display panels and control elements thereof are respectively disposed on the front side and the rear side of the body, and are interconnected by bending and extending at the flexible carrier film between the front side and the rear side. Under such configuration, the non-bending section of the flexible carrier film is generally adhered to the body by a double-sided tape. However, the stress generated by the flexible carrier film due to bending may easily cause the double-sided tape to be separated from the flexible carrier film or the body under a state of high temperature and high humidity. If in order to overcome the above issue, the adhesion at the bending section of the flexible carrier film is strengthened in an adhesive-filling manner, the adhesive material may overflow to the double-sided tape and cause the double-sided tape to lose viscosity, or overflow to other parts of the device and cause pollution.

SUMMARY

The disclosure provides a display, which enables a flexible carrier film to be stably disposed on a carrying main body.

The display of the disclosure includes a carrying main body, a flexible carrier film, a double-sided tape, and an adhesive layer. The flexible carrier film includes a first bonding section, a second bonding section, and a bending section. The first bonding section and the second bonding section are respectively disposed on two opposite sides of the carrying main body. The bending section is connected between the first bonding section and the second bonding section. The flexible carrier film has an inner surface and an outer surface opposite to each other. The inner surface has at least one first groove at the bending section. The flexible carrier film has a display layer thereon. At least a part of the display layer is connected to the outer surface at the second bonding section. The double-sided tape is disposed between the first bonding section and the carrying main body. The adhesive layer is disposed between the inner surface and the carrying main body at the bending section.

In an embodiment of the disclosure, the bending section extends from the second bonding section to the first bonding section along a first direction, at least one first groove extends along a second direction, and the second direction is perpendicular to the first direction.

In an embodiment of the disclosure, the number of the at least one first groove is multiple and the first grooves are sequentially arranged along the first direction.

In an embodiment of the disclosure, the inner surface has at least one second groove at the bending section and the at least one second groove extends along the first direction.

In an embodiment of the disclosure, the flexible carrier film has two edge regions, at least one first groove is located between the two edge regions, and at least one second groove is located at at least one edge region.

In an embodiment of the disclosure, the inner surface has at least one second groove at the bending section and the at least one second groove extends from the bending section to the second bonding section.

In an embodiment of the disclosure, the adhesive layer includes at least two adhering parts and the at least two adhering parts are respectively located at different positions on the inner surface and are separated from each other.

In an embodiment of the disclosure, the bending section extends from the second bonding section to the first bonding section along a first direction and at least two adhering parts are separated from each other in the first direction.

In an embodiment of the disclosure, the adhesive layer includes at least two adhering parts, the at least two adhering parts are located at different positions on the inner surface, and materials of the at least two adhering parts are different.

In an embodiment of the disclosure, the display further includes a film, wherein the film is disposed on the first bonding section, the double-sided tape is disposed on the film, an end of the film faces the bending section, and at least one first groove and the end of the film have a spacing therebetween.

In an embodiment of the disclosure, the display further includes a film, wherein the film is disposed on the first bonding section, the double-sided tape is disposed on the film, and the film has at least one third groove.

In an embodiment of the disclosure, the bending section extends from the second bonding section to the first bonding section along a first direction, at least one third groove extends along a second direction, and the second direction is perpendicular to the first direction.

In an embodiment of the disclosure, the bending section extends from the second bonding section to the first bonding section along a first direction, the bending section includes a first sub-section and a second sub-section, the first sub-section is connected between the second bonding section and the second sub-section, the width of the second sub-section along a second direction perpendicular to the first direction is greater than the width of the first sub-section along the second direction.

In an embodiment of the disclosure, the carrying main body has an end surface, the end surface faces the bending section and is not located in a depressed space formed by the bending section, and the adhesive layer is disposed on the end surface.

In an embodiment of the disclosure, the volume of the adhesive layer is 50% to 70% of the volume of a Tillable space between the flexible carrier film and the carrying main body.

In an embodiment of the disclosure, the carrying main body has an end surface and a convex part extending from the end surface, the end surface faces the bending section and is not located in a depressed space formed by the bending section, at least a part of the convex part is located in the depressed space, and the adhesive layer is disposed on the convex part.

In an embodiment of the disclosure, the bending section extends from the second bonding section to the first bonding section along a first direction, the inner surface forms a concave surface at the bending section, the radius of curvature of the concave surface is R, and the length of extension of the adhesive layer along the first direction is greater than or equal to $\pi R/2$.

In an embodiment of the disclosure, the flexible carrier film has at least one perforation at the bending section.

Based on the above, in the display of the disclosure, in addition to disposing the bonding section of the flexible carrier film to the carrying main body in an adhering manner using a double-sided tape, the bending section of the flexible carrier film is further disposed to the carrying main body in an adhering manner using the adhesive layer to stably fix the whole flexible carrier film, so as to prevent the bonding section from being separated from the carrying main body due to the bending stress of the bending section. In addition, the flexible carrier film has grooves at the bending section thereof that may limit the flow range of the adhesive material in a specific direction, so that the case where the adhesive material overflows to the double-sided tape and causes the double-sided tape to lose viscosity may be prevented.

To make the aforementioned and other features of the disclosure more comprehensible, several embodiments accompanied with drawings are described in detail as follows.

DETAILED DESCRIPTION OF DISCLOSED EMBODIMENTS

Figure 1:
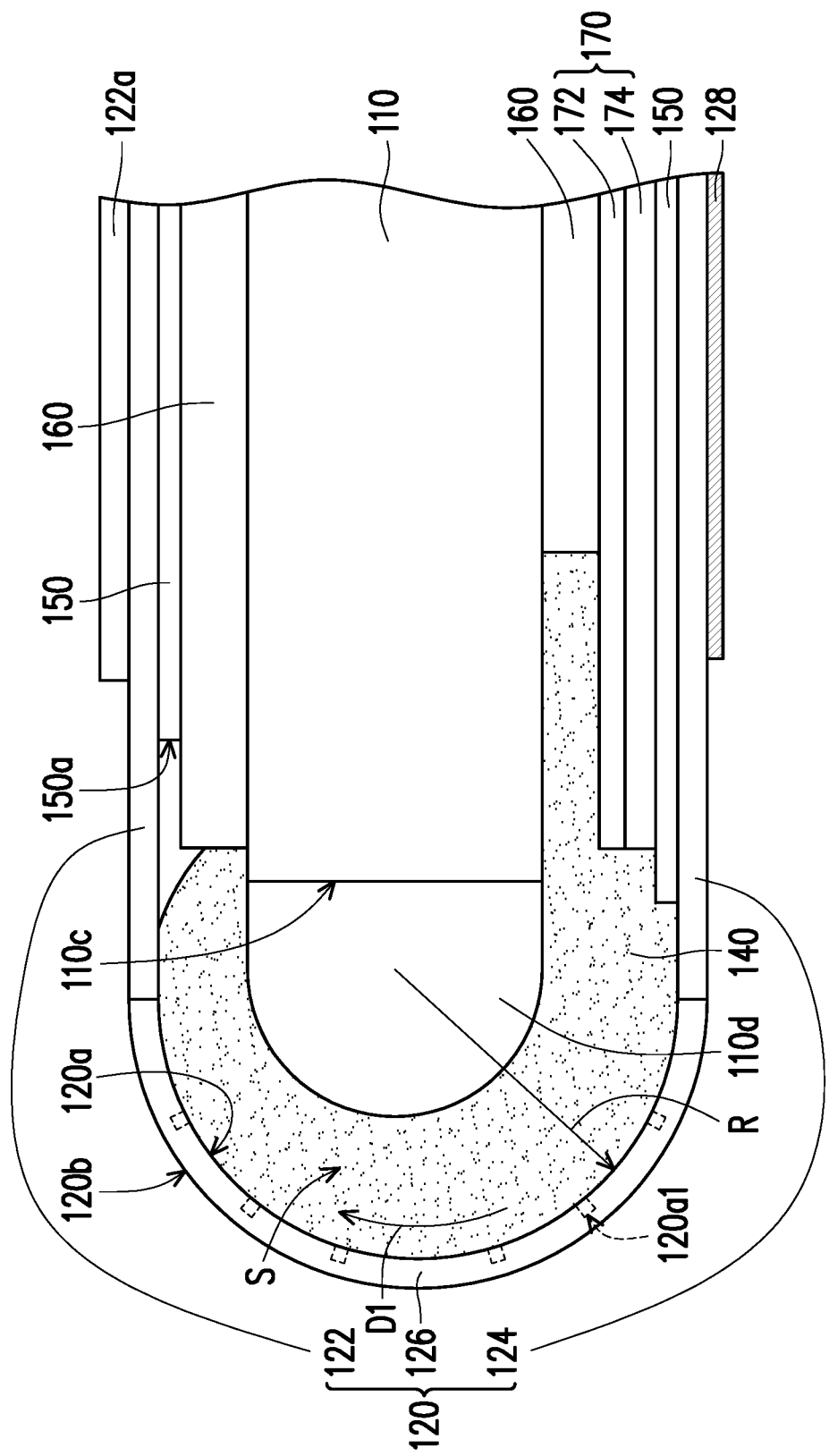
FIG. 1 is a partial cross-sectional view of a display according to an embodiment of the disclosure.

FIG. 1 is a partial cross-sectional view of a display according to an embodiment of the disclosure. Please refer to FIG. 1. A display 100 of the embodiment includes a carrying main body 110, a flexible carrier film 120, an adhesive layer 140, two films 150, and a double-sided tape 160. The flexible carrier film 120 is composed of an insulating film, a metal film, etc. and has a circuit element and a display medium (such as a display medium 132 described later) thereon. The flexible carrier film 120 includes a first bonding section 122, a second bonding section 124, and a bending section 126. The first bonding section 122 and the second bonding section 124 are respectively disposed on opposite sides of the carrying main body 110. The bending section 126 is connected between the first bonding section 122 and the second bonding section 124.

The flexible carrier film 120 has an inner surface 120a and an outer surface 120b opposite to each other. The flexible carrier film 120 has a display layer 128 thereon. The display layer 130 is connected to the outer surface 120b of the flexible carrier film 120 at the second bonding section 124 of the flexible carrier film 120. In other embodiments, the display layer 128 may extend to the bending section 126 and may further extend to the first bonding section 122, and the disclosure does not limit the position of the display layer 128 on the flexible carrier film 120. The display layer 130 includes a display medium 132 disposed on the second bonding section 124, a protective cover plate 134, and an adhesive layer 136 adhered between the display medium 132 and the protective cover plate 134. The protective cover plate 134 is a soft protective film. The material of the film 150 is, for example, polyethylene terephthalate (PET). The two films 150 are respectively disposed on the first bonding section 122 and the second bonding section 124 of the flexible carrier film 120. A supporting film 170 is located between the carrying main body 110 and the film 150 on the second bonding section 124. The supporting film 170 includes a supporting material 172 and an adhesive layer 174 disposed between the supporting material 172 and the film 150 in an adhering manner. The double-sided tape 160 is disposed between the film 150 on the first bonding section 122 of the flexible carrier film 120 and the carrying main body 110 in an adhering manner, and is disposed between the supporting material 172 and the carrying main body 110 in an adhering manner. The adhesive layer 140 is disposed between the inner surface 120a of the flexible carrier film 120 and the carrying main body 110 in an adhering manner at the bending section 126 of the flexible carrier film 120. The adhesive layer 140 is also disposed between the second bonding section 124 of the flexible carrier film 120 and the carrying main body 110 in an adhering manner. The first bonding section 122 has a protective film 122a thereon.

As described above, in the embodiment, the first bonding section 122 of the flexible carrier film 120 is disposed on the carrying main body 110 in an adhering manner by the double-sided tape 160, and the bending section 126 and the second bonding section 124 of the flexible carrier film 120 are further disposed on the carrying main body 110 in an adhering manner by the adhesive layer 140 to stably fix the whole flexible carrier film 120, so as to prevent the first bonding section 122 from being separated from the carrying main body 110 due to the bending stress of the bending section 126.

Figure 2A:
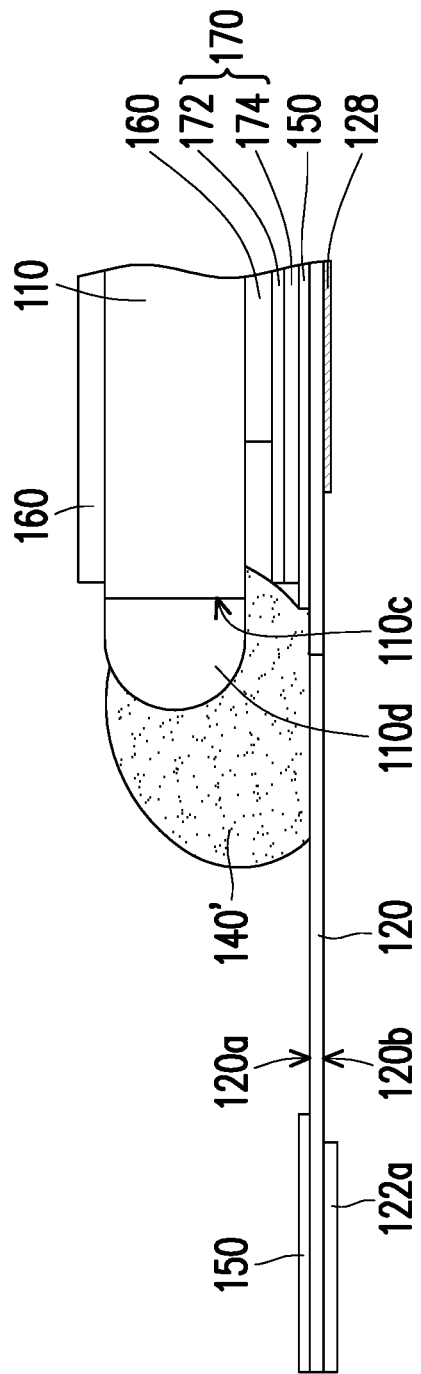
FIG. 2A and FIG. 2B illustrate a process of adhering a flexible carrier film of FIG. 1 to a carrying main body.
Figure 2B:
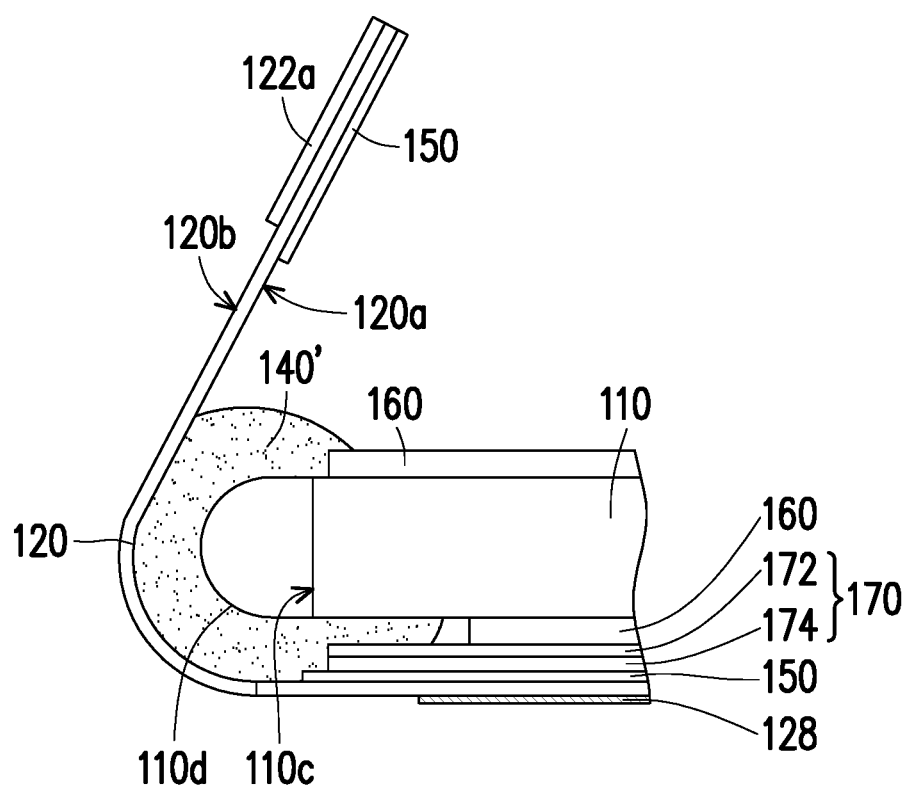

FIG. 2A and FIG. 2B illustrate a process of adhering a flexible carrier film of FIG. 1 to a carrying main body. In the process of manufacturing the display 100, an adhesive material 140' may be provided on the flexible carrier film 120 that has not been bent as shown in FIG. 2A. Then, the flexible carrier film 120 is bent upward as shown in FIG. 2B to the state shown in FIG. 1, such that the adhesive material 140' flows to two upper and lower sides of the carrying main body 110 due to the pushing and squeezing of the flexible carrier film 120. The adhesive material 140' of the embodiment is, for example, a heat-curable adhesive material. In the above process, the adhesive material 140' may be gradually heated to be cured into the adhesive layer 140 shown in FIG. 1. The heat-curable adhesive material is preferably a low-temperature heat-curable adhesive material. In other embodiments, the adhesive material 140' may be other types of adhesive material, such as a light-curable adhesive material, a moisture-curable adhesive material, etc., which is not limited by the disclosure.

Figure 3:
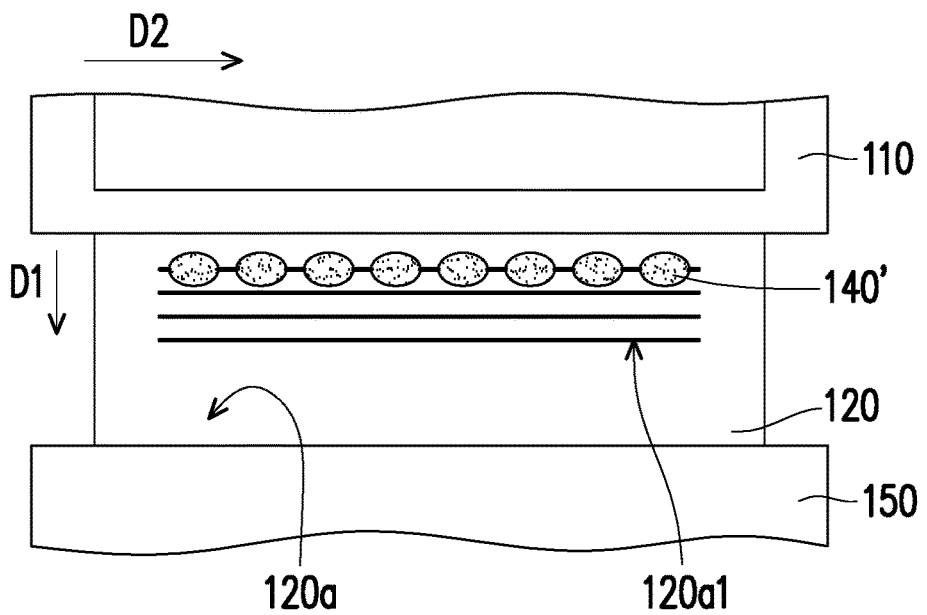
FIG. 3 is a top schematic view of the structure shown in FIG. 2A.

FIG. 3 is a top schematic view of the structure shown in FIG. 2A. Please refer to FIG. 1 and FIG. 3. The inner surface 120a of the flexible carrier film 120 of the embodiment has multiple first grooves 120a1 at the bending section 126. The bending section 126 extends from the second bonding section 124 to the first bonding section 122 along a first direction D1, each first groove 120a1 extends along a second direction D2 perpendicular to the first direction D1, and the first grooves 120a1 are sequentially arranged along the first direction D1. Under such configuration, the first grooves 120a1 may limit the flow range of the adhesive material 140' in the first direction D1, so that the case where the adhesive material 140' overflows to the double-sided tape 160 and causes the double-sided tape 160 to lose viscosity may be prevented. In addition, the first groove 120a1 may guide the adhesive material 140' to flow in the second direction D2, such that the adhesive material 140' is evenly distributed.

Please refer to FIG. 1. Further, an end 150a of the film 150 faces the bending section 126 of the flexible carrier film 120, and the first groove 120a1 closest to the film 150 and the end 150a of the film 150 has a spacing therebetween. Thus, in addition to the first groove 120a1 having the function of limiting the flow of the adhesive material 140', the end 150a of the film 150 also has the function of further limiting the flow of the adhesive material 140'. In addition, the two opposite ends of the first groove 120a1 (that is, the two left and right ends of the first groove 120a1 shown in FIG. 3) also have the function of limiting the flow of the adhesive material 140'.

In other embodiments, the direction of extension of the first groove 120a1 may not be perpendicular to the first direction D1, which is not limited by the disclosure. In addition, in other embodiments, the inner surface 120a of the flexible carrier film 120 may have grooves extending along other directions at the bending section 126, which is exemplified using drawings in the following.

Figure 4:
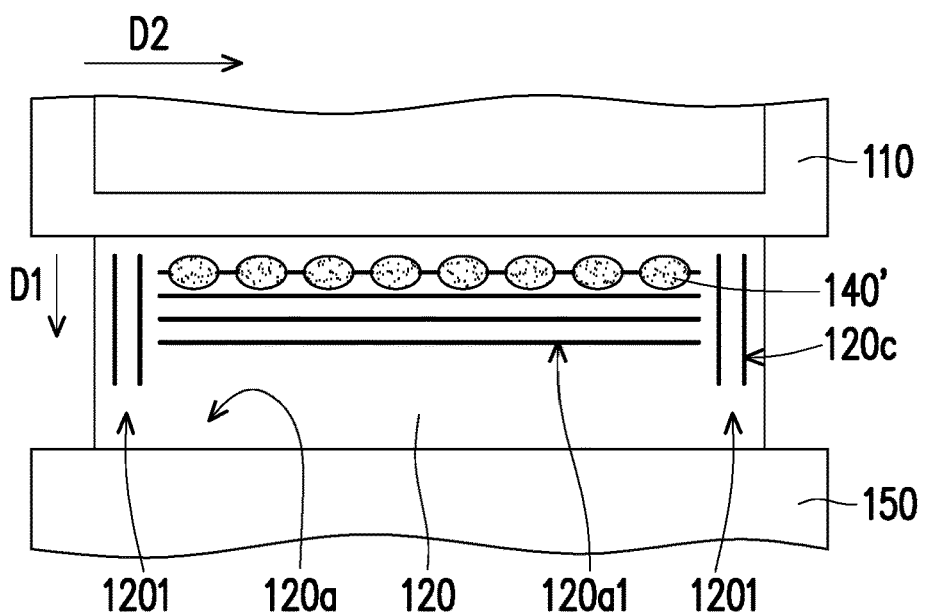
FIG. 4 illustrates the flexible carrier film of FIG. 3 added with second grooves.

FIG. 4 illustrates the flexible carrier film of FIG. 3 added with second grooves. The inner surface 120a of the flexible carrier film 120 may have multiple second grooves 120c at the bending section 126 as shown in FIG. 4, and each second groove 120c extends along the first direction D1. Specifically, the first grooves 120a1 are located between two edge regions 1201 of the flexible carrier film 120, and the second grooves 120c are respectively located at the two edge regions 1201 to limit the flow range of the adhesive material 140' using the second grooves 120c, so as to prevent the adhesive material 140' from overflowing out of the flexible carrier film 120 from the two edge regions 1201.

Figure 5:
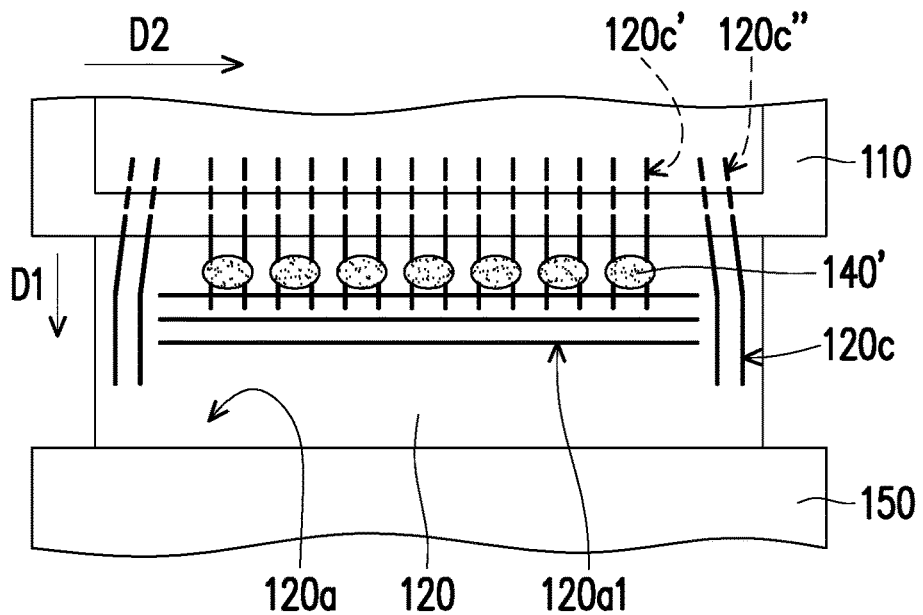
FIG. 5 illustrates the flexible carrier film of FIG. 4 added with more second grooves.

FIG. 5 illustrates the flexible carrier film of FIG. 4 added with more second grooves. The inner surface 120a of the flexible carrier film 120 may have more second grooves 120c' and 120c'' at the bending section 126 as shown in FIG. 5. The second grooves 120c' and 120c'' extend from the bending section 126 (labelled in FIG. 1) to the second bonding section 124 (labelled in FIG. 1), such that the adhesive material 140' flows toward the second bonding section 124 by the guidance of the second grooves 120c' and 120c''. The second groove 120c', for example, extends along the first direction D1 and intersects with a part of the first groove 120a1. The second groove 120c'', for example, extends along a direction inclined to the first direction D1 and is connected to the second grooves 120c, but the disclosure is not limited thereto.

In the case where the area of extension of the flexible carrier film 120 is large, in order to save the amount of the adhesive material 140' used, the adhesive material 140' may be provided on the flexible carrier film 120 in a segmented manner, which is exemplified using drawings in the following.

Figure 6:
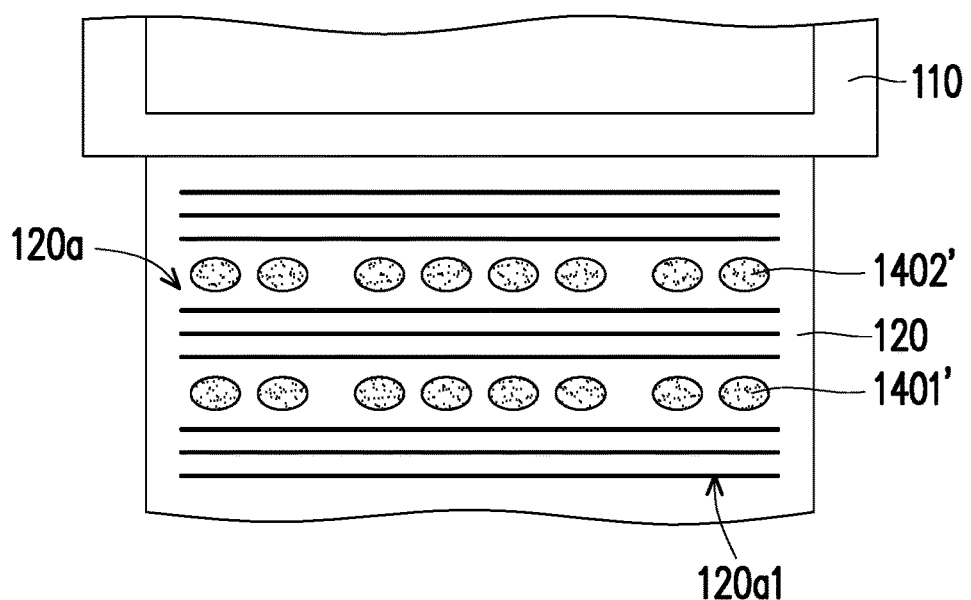
FIG. 6 illustrates an adhesive material provided on a flexible carrier film in a segmented manner according to another embodiment.
Figure 7:
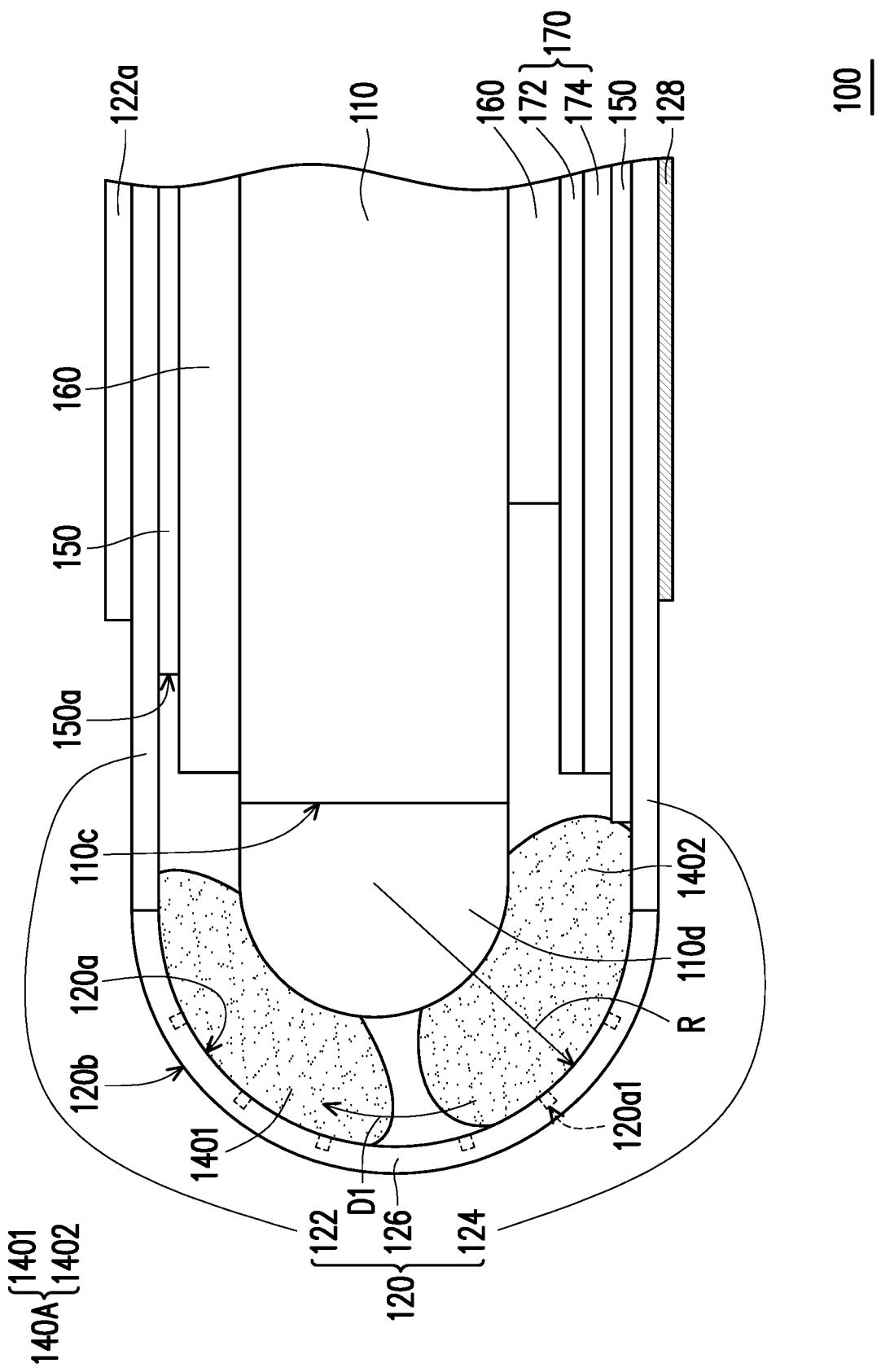
FIG. 7 illustrates a display corresponding to the structure shown in FIG. 6.

FIG. 6 illustrates an adhesive material provided on a flexible carrier film in a segmented manner according to another embodiment. FIG. 7 illustrates a display corresponding to the structure shown in FIG. 6. In the embodiment, adhesive materials 1401' and 1402'' are provided on the flexible carrier film 120 in a segmented manner as shown in FIG. 6. After the flexible carrier film 120 is disposed on the carrying main body 110 in an adhering manner by the adhesive materials 1401' and 1402', an adhesive layer 140A is formed by curing the adhesive materials 1401' and 1402', and includes two adhering parts 1401 and 1402 as shown in FIG. 7. The two adhering parts 1401 and 1402 are respectively located at different positions on the inner surface 120a of the flexible carrier film 120 and are separated from each other in the first direction D1.

Figure 8:
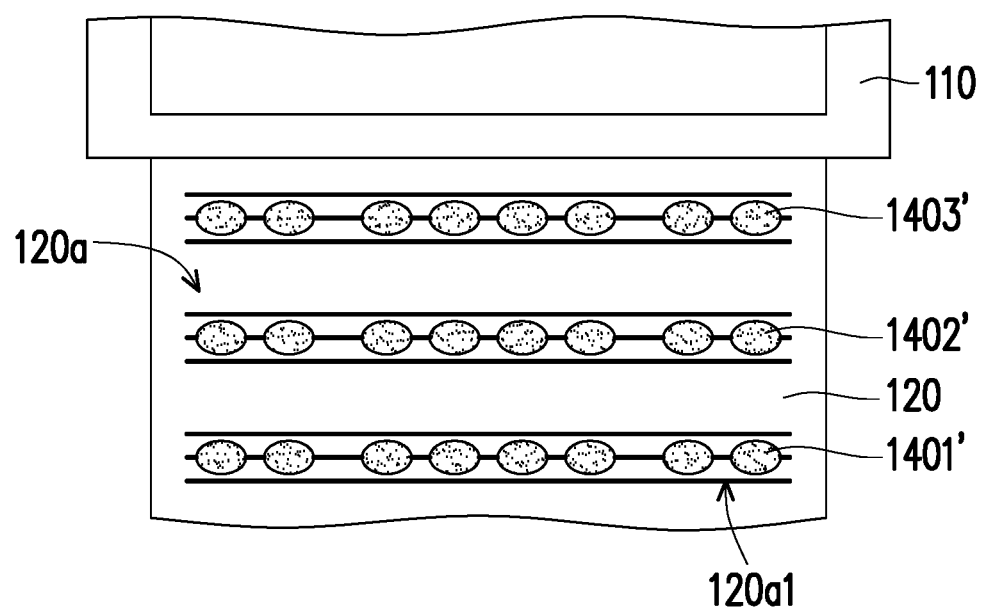
FIG. 8 illustrates an adhesive material provided on a flexible carrier film in a segmented manner according to another embodiment.
Figure 9:
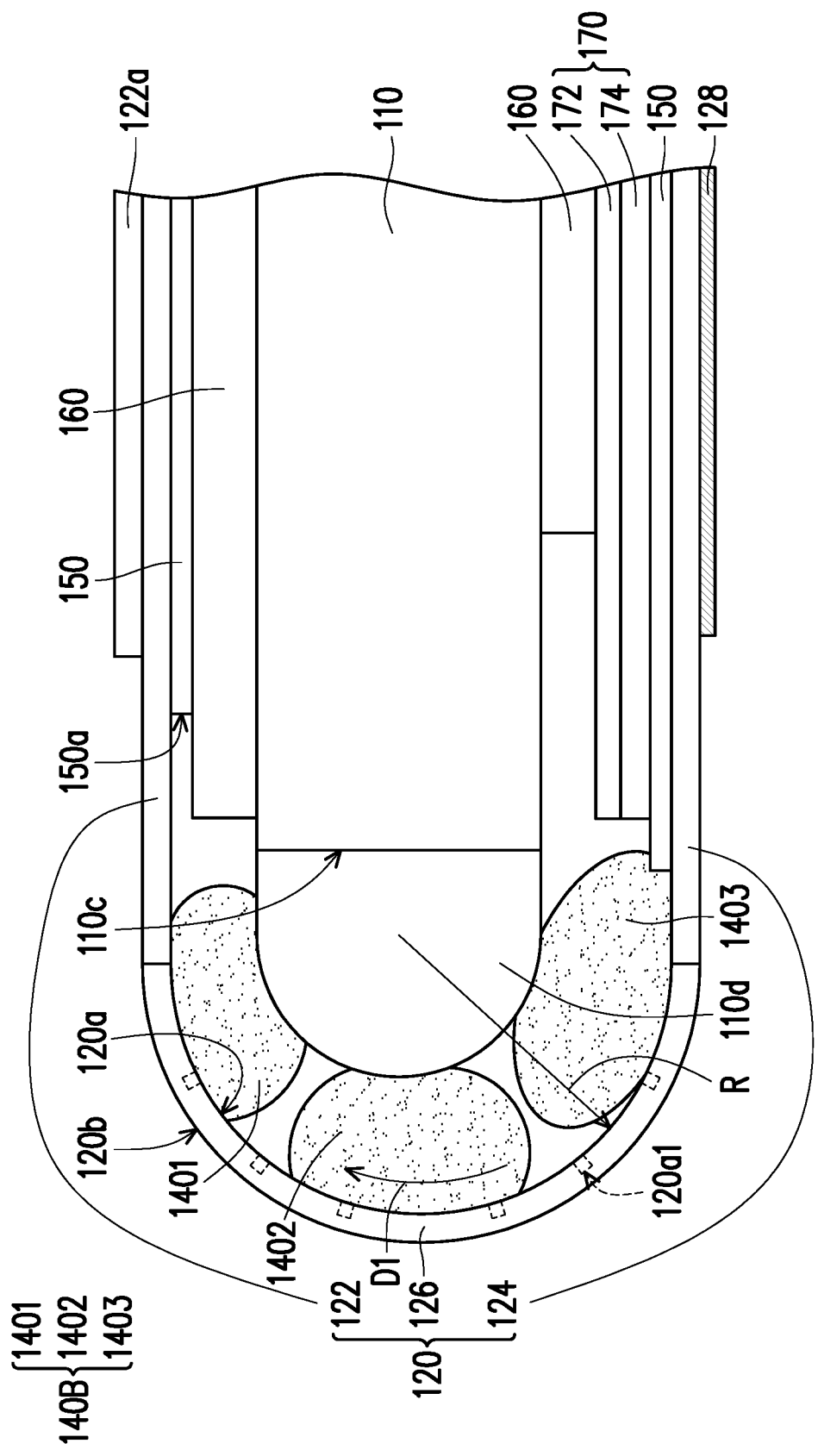
FIG. 9 illustrates a display corresponding to the structure shown in FIG. 8.

FIG. 8 illustrates an adhesive material provided on a flexible carrier film in a segmented manner according to another embodiment. FIG. 9 illustrates a display corresponding to the structure shown in FIG. 8. In the embodiment, adhesive materials 1401', 1402', and 1403' are provided on the flexible carrier film 120 in a segmented manner as shown in FIG. 8. After the flexible carrier film 120 is disposed on the carrying main body 110 in an adhering manner by the adhesive materials 1401', 1402', and 1403', an adhesive layer 140B is formed by curing the adhesive materials 1401', 1402', and 1403', and includes three adhering parts 1401, 1402, and 1403 as shown in FIG. 9. The three adhering parts 1401, 1402, and 1403 are respectively located at different positions on the inner surface 120a of the flexible carrier film 120 and are separated from one another in the first direction D1.

As described above, the adhesive layer is divided into multiple adhering parts having a spacing from one another, which can provide more flow space for the adhesive materials, so there is also the effect of preventing the adhesive materials from overflowing. In other embodiments, the adhesive materials may include a larger number of adhering parts separated from one another, which is not limited by the disclosure. In addition, in the foregoing embodiment, the adhesive layer is made of a single material, but the disclosure is not limited thereto, which is exemplified using drawings in the following.

Figure 10:
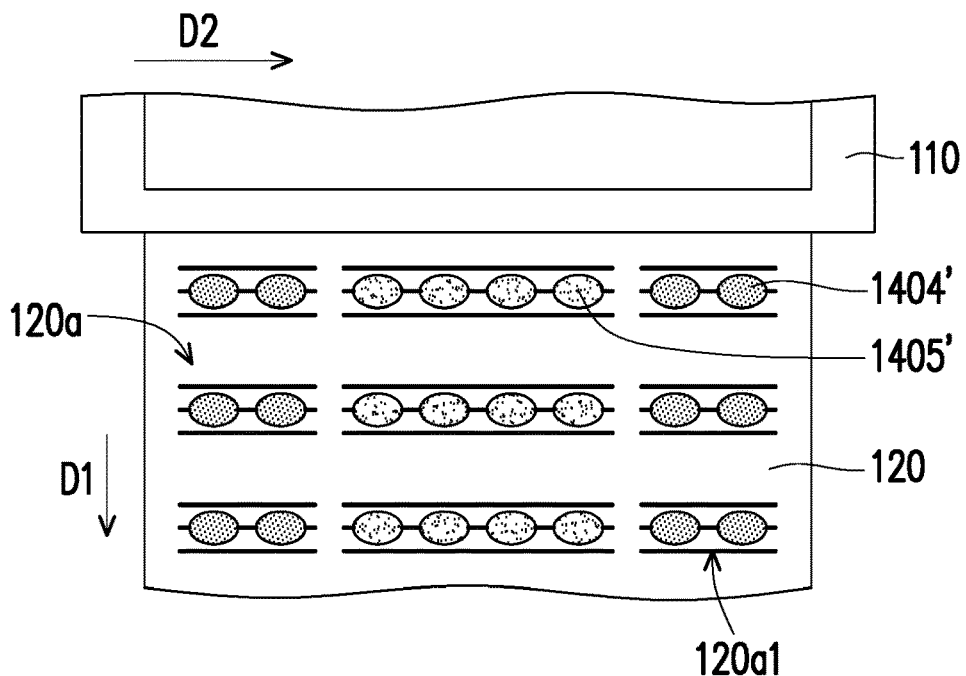
FIG. 10 illustrates a flexible carrier film having different materials of adhesive materials thereon according to another embodiment of the disclosure.
Figure 11:
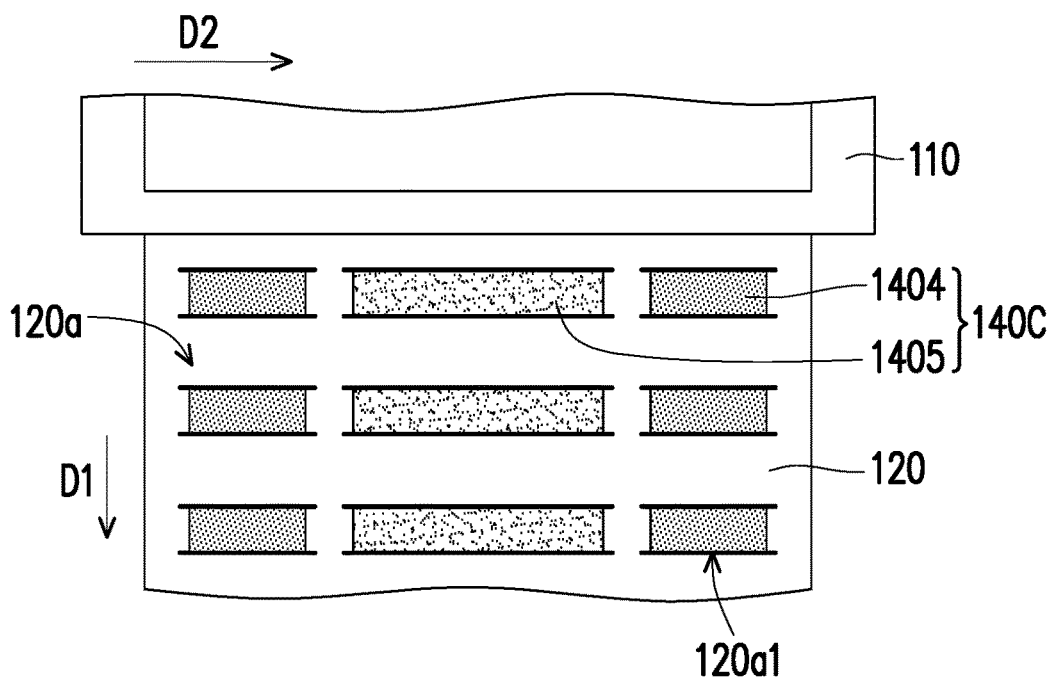
FIG. 11 illustrates the adhesive materials of FIG. 10 flowing and curing to form an adhesive layer.

FIG. 10 illustrates a flexible carrier film having different materials of adhesive materials thereon according to another embodiment of the disclosure. FIG. 11 illustrates the adhesive materials of FIG. 10 flowing and curing to form an adhesive layer. It should be noted that, for the drawing to be clearer, FIG. 11 does not illustrate the flexible carrier film 120 as being bent and disposed on the carrying main body 110 in an adhering manner, but this is only an illustration. Actually, an adhesive layer 140C shown in FIG. 11 is only formed after the flexible carrier film 120 is bent and disposed on the carrying main body 110 in an adhering manner (as shown in the state of the flexible carrier film 120 in FIG. 1). In the embodiment, different materials of adhesive materials 1404' and 1405' are provided on the flexible carrier film 120 as shown in FIG. 10. After the flexible carrier film 120 is disposed on the carrying main body 110 in an adhering manner by the adhesive materials 1404' and 1405', a part of the adhesive layer 140C is cured by the adhesive materials 1404' and 1405', and includes two adhering parts 1404 and 1405 as shown in FIG. 11. The two adhering parts 1404 and 1405 are respectively located at different positions on the inner surface 120a of the flexible carrier film 120 and are sequentially arranged along a direction perpendicular to the second direction D2. The materials of the two adhering parts 1404 and 1405 are different.

Further, if the trace of the flexible carrier film 120 at where the adhering part 1404 is located is closer to the inner surface 120a and farther away from the outer surface 120b (as labelled in FIG. 1), the adhering part 1404 may be made of a material with higher hardness to resist the compressional force acting on the trace due to the bending of the flexible carrier film 120. Conversely, if the trace of the flexible carrier film 120 at where the adhering part 1404 is located is closer to the outer surface 120b (as labelled in FIG. 1) and farther away from the inner surface 120a, the adhering part 1404 may be made of a material with lower hardness to prevent the tension acting on the trace from being too large after the flexible carrier film 120 is bent due to the adhering part 1404 being too hard. Similarly, if the trace of the flexible carrier film 120 at where the adhering part 1405 is located is closer to the inner surface 120a and farther away from the outer surface 120b (as labelled in FIG. 1), the adhering part 1405 may be made of a material with higher hardness to resist the compressional force acting on the trace due to the bending of the flexible carrier film 120. Conversely, if the trace of the flexible carrier film 120 at where the adhering part 1405 is located is closer to the outer surface 120b (as labelled in FIG. 1) and farther away from the inner surface 120a, the adhering part 1405 may be made of a material with lower hardness to prevent the tension acting on the trace from being too large after the flexible carrier film 120 is bent due to the adhering part 1405 being too hard.

Figure 12:
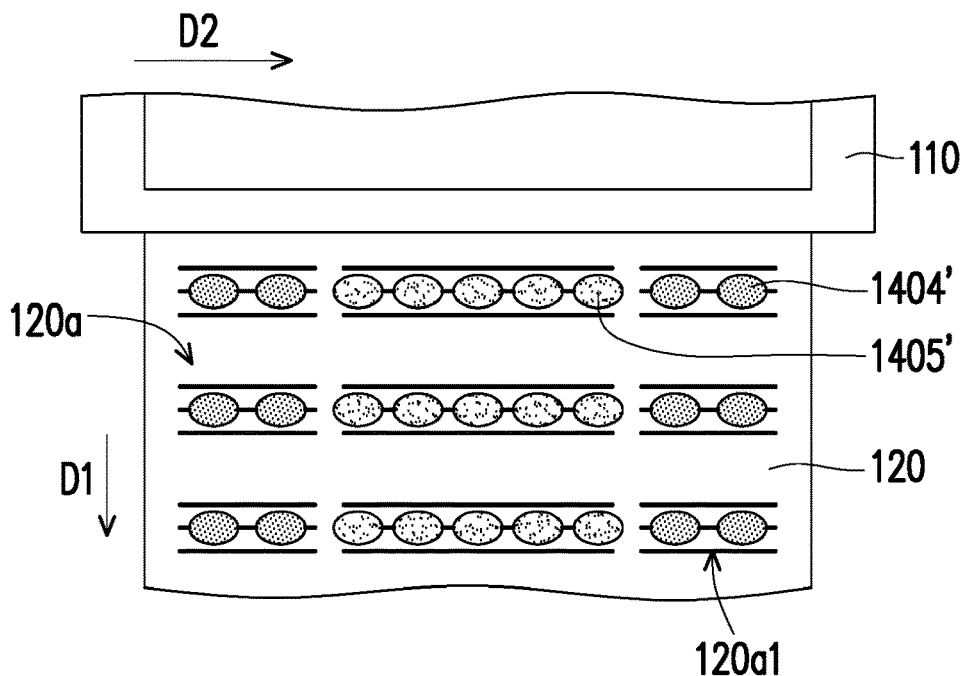
FIG. 12 illustrates a flexible carrier film having different materials of adhesive materials thereon according to another embodiment of the disclosure.
Figure 13:
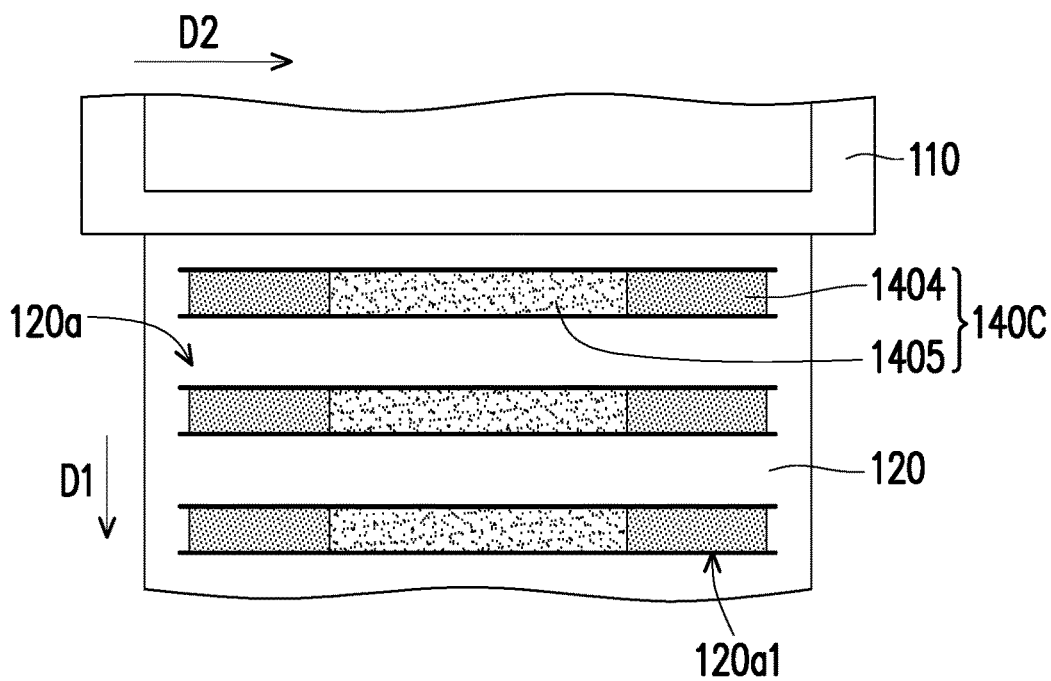
FIG. 13 illustrates the adhesive materials of FIG. 12 flowing and curing to form an adhesive layer.

FIG. 12 illustrates a flexible carrier film having different materials of adhesive materials thereon according to another embodiment of the disclosure. FIG. 13 illustrates the adhesive materials of FIG. 12 flowing and curing to form an adhesive layer. The difference between the embodiment shown in FIG. 12 and FIG. 13 and the embodiment shown in FIG. 10 and FIG. 11 is that a larger amount of adhesive material 1405' is disposed in FIG. 12, such that the adhering parts 1404 and 1405 formed by curing the adhesive materials 1404' and 1405' are connected to each other as shown in FIG. 13.

Figure 14:
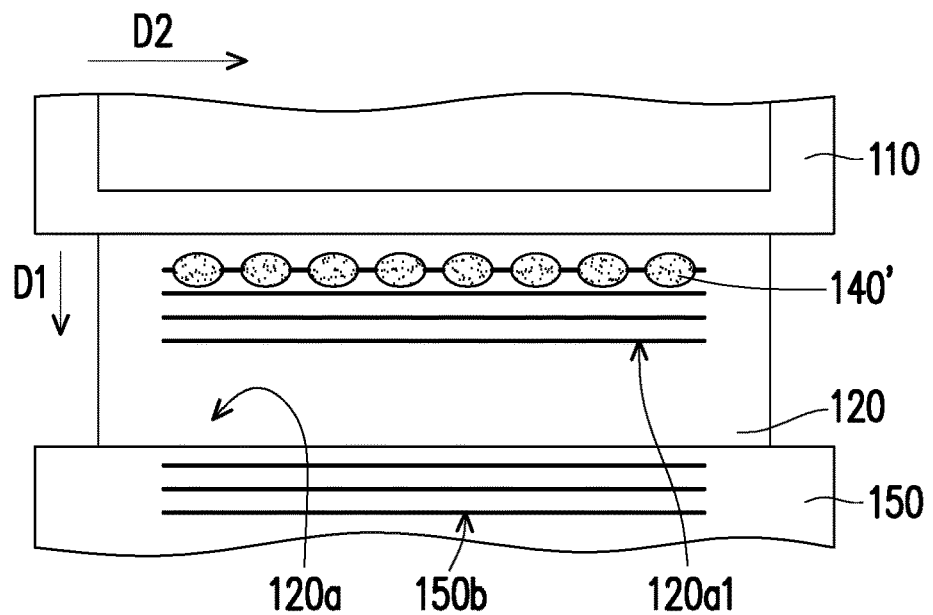
FIG. 14 illustrates a film of FIG. 3 added with a third groove.

FIG. 14 illustrates a film of FIG. 3 added with a third groove. The difference between the embodiment shown in FIG. 14 and the embodiment shown in FIG. 3 is that the film 150 of FIG. 14 has multiple third grooves 150b. Each third groove 150b extends along the second direction D2 and the third grooves 150b are sequentially arranged along the first direction D1. Under the configuration of the third grooves 150b, the flow of the adhesive material 140' may be further limited at the film 150.

Figure 15:
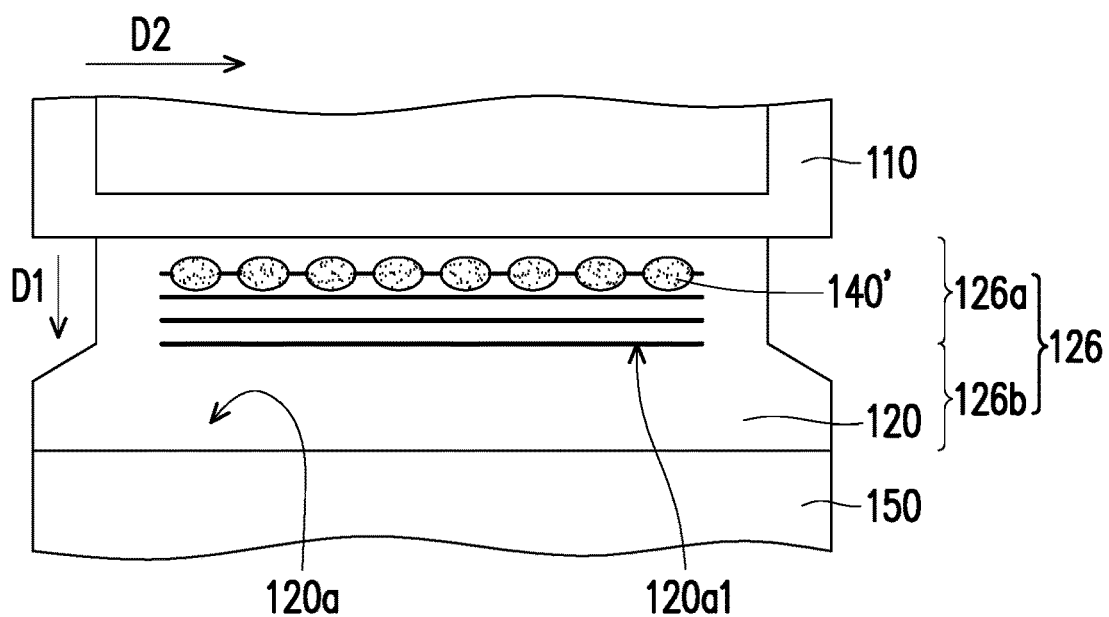
FIG. 15 illustrates a partial widening of a bending section of FIG. 3.

FIG. 15 illustrates a partial widening of a bending section of FIG. 3. The difference between the embodiment shown in FIG. 15 and the embodiment shown in FIG. 3 is that the bending section 126 of the flexible carrier film 120 of FIG. 15 includes a first sub-section 126a and a second sub-section 126b. The first sub-section 126a is connected between the second bonding section 124 (as labelled in FIG. 1) and the second sub-section 126b, and the width of the second sub-section 126b along the second direction D2 is greater than the width of the first sub-section 126a along the second direction D2. In this way, the adhesive material 140' may be further ensured to not overflow out of the flexible carrier film 120.

The first groove in each foregoing embodiment is, for example, formed by laser processing to partially remove the thickness of 30% to 70% of the flexible carrier film, formed by forming a dummy on the flexible carrier film, or a surface microstructure formed by surface treatment methods such as ultraviolet irradiation, laser irradiation, plasma treatment, fluorine coating, etc., which is not limited by the disclosure. The second groove and the third groove in the foregoing embodiments may also be formed in the same or similar manner.

Please refer to FIG. 1. The carrying main body 110 has an end surface 110c and a convex part 110d extending from the end surface 110c. The end surface 110c faces the bending section 126 of the flexible carrier film 120 and is not located in a depressed spaced S formed by the bending section 126. At least a part of the convex part 110d is located in the depressed space S. The adhesive layer 140 is disposed on the convex part 110d in an adhering manner. By adding the convex part 110d to the end surface 110c of the carrying main body 110, the structural strength of the whole structure at the bending section 126 of the flexible carrier film 120 may be increased. Therefore, if the adhesive layer 140 has an appropriate hardness, sufficient structural strength may be provided. For example, the Young's modulus of the adhesive layer of the embodiment is between 1 MPa and 20 GPa.

Figure 16:
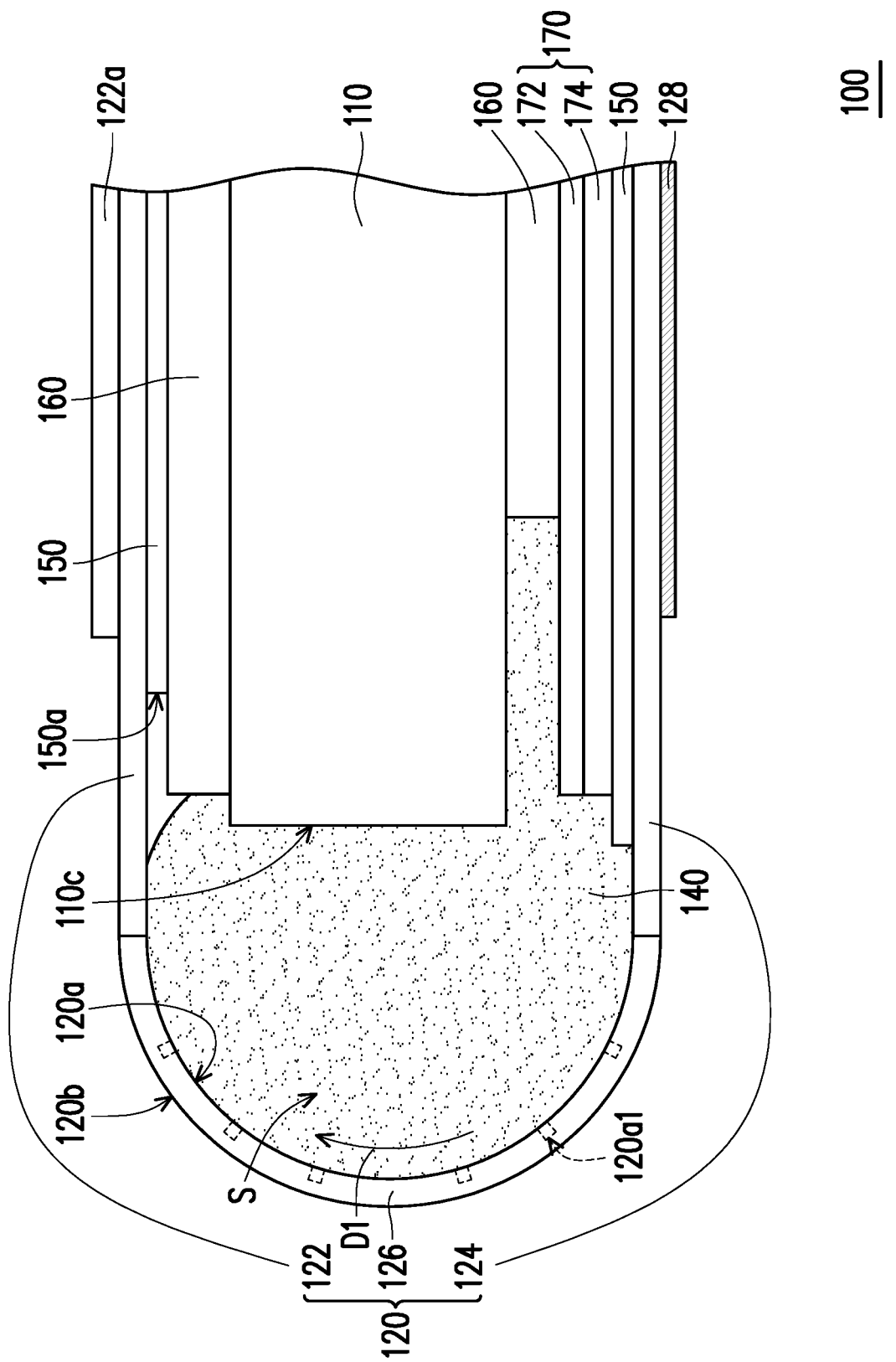
FIG. 16 is a partial cross-sectional view of a display according to another embodiment of the disclosure.

FIG. 16 is a partial cross-sectional view of a display according to another embodiment of the disclosure. The differences between the embodiment shown in FIG. 16 and the embodiment shown in FIG. 1 is that the carrying main body 110 of FIG. 16 is not added with the convex part 110d at the end surface 110c thereof and the adhesive layer 140 is disposed on the end surface 110c in an adhering manner. Correspondingly, the Young's modulus of the adhesive layer 140 is, for example, between 1 GPa and 20 GPa, and has higher hardness, so as to provide sufficient structural strength at the bending section 126 of the flexible carrier film 120. The end surface 110c of the embodiment may be flat as shown in FIG. 16 or arced, which is not limited by the disclosure.

In any of the foregoing embodiments, the viscosity of the adhesive material 140' is, for example, between 3000 cP and 30000 cP for easy operation. The viscosity of the adhesive material 140' may also be between 100 cP and 3000 cP, and a surface pretreatment such as micro-machining, partial ultraviolet irradiation, etc. is performed for easy operation. In addition, if the adhesive material 140' contains a volatile solvent, multiple perforations with an aperture diameter of, for example, 1 to 50 microns may be pre-formed at the bending section 126 of the flexible carrier film 120, such that the volatile solvent may pass through the perforations to dissipate.

In addition, the amount of the adhesive material 140' required may be estimated according to conditions such as the width of the flexible carrier film 120, the spacing between the flexible carrier film 120 and the carrying main body 110, the curvature of the bending section 126, etc. For example, the volume of the adhesive layer 140 is 50% to 70% of the volume of the Tillable space between the flexible carrier film 120 and the carrying main body 110. More specifically, the inner surface 120a of the flexible carrier film 120 forms a concave surface at the bending section 126, and the radius of curvature of the concave surface is R (as labelled in FIG. 1). The radius R may be estimated as half of the spacing between the first bonding section 122 and the second bonding section 124 shown in FIG. 1. The length of extension of the adhesive layer 140 along the first direction D1 is, for example, greater than or equal to πR/2, such that the adhesive layer 140 provides sufficient structural strength at the bending section 126. Furthermore, compared to the case where the convex part 110d is disposed as shown in FIG. 1, in the case where the convex part 110d is not disposed as shown in FIG. 16, the amount of the adhesive material 140' may be increased to improve the structural strength.

In summary, in the display of the disclosure, in addition to disposing the bonding section of the flexible carrier film to the carrying main body in an adhering manner using a double-sided tape, the bending section of the flexible carrier film is further disposed to the carrying main body in an adhering manner using the adhesive layer to stably fix the whole flexible carrier film, so as to prevent the bonding section from being separated from the carrying main body due to the bending stress of the bending section. In addition, the flexible carrier film has grooves at the bending section thereof that may limit the flow range of the adhesive material in a specific direction, so that the case where the adhesive material overflows to the double-sided tape and causes the double-sided tape to lose viscosity may be prevented. In addition, the film on the flexible carrier film may also have grooves that restrict the flow range of the adhesive material in a specific direction, and the bending section of the flexible carrier film may be partially widened to further prevent the adhesive material from overflowing.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display, comprising:
   a carrying main body;
   a flexible carrier film, comprising a first bonding section, a second bonding section, and a bending section, wherein the first bonding section and the second bonding section are respectively disposed on two opposite sides of the carrying main body, the bending section is connected between the first bonding section and the second bonding section, the flexible carrier film has an inner surface and an outer surface opposite to each other, the inner surface has at least one first groove at the bending section, the flexible carrier film has a display layer thereon, and at least a part of the display layer is connected to the outer surface at the second bonding section;
   a double-sided tape, disposed between the first bonding section and the carrying main body;
   an adhesive layer, disposed between the inner surface and the carrying main body at the bending section, wherein the carrying main body has an end surface, the end surface faces the bending section and is not located in a depressed space formed by the bending section, and at least part of the adhesive layer is located between the end surface and the bending section; and
   a film, wherein the film is disposed on the first bonding section, the double-sided tape is disposed on the film, and the film has at least one third groove.

2. The display according to claim 1, wherein the bending section extends from the second bonding section to the first bonding section along a first direction, the at least one first groove extends along a second direction, and the second direction is perpendicular to the first direction.

3. The display according to claim 2, wherein a number of the at least one first groove is plural and the plurality of first grooves are sequentially arranged along the first direction.

4. The display according to claim 2, wherein the inner surface has at least one second groove at the bending section and the at least one second groove extends along the first direction.

5. The display according to claim 4, wherein the flexible carrier film has two edge regions, the at least one first groove is located between the two edge regions, and the at least one second groove is located at at least one of the two edge regions.

6. The display according to claim 2, wherein the inner surface has at least one second groove at the bending section and the at least one second groove extends from the bending section to the second bonding section.

7. The display according to claim 1, wherein the adhesive layer comprises at least two adhering parts and the at least two adhering parts are respectively located at different positions on the inner surface and are separated from each other.

8. The display according to claim 7, wherein the bending section extends from the second bonding section to the first bonding section along a first direction and the at least two adhering parts are separated from each other in the first direction.

9. The display according to claim 1, wherein the adhesive layer comprises at least two adhering parts, the at least two adhering parts are respectively located at different positions on the inner surface, and materials of the at least two adhering parts are different.

10. The display according to claim 1, wherein an end of the film faces the bending section, and the at least one first groove and the end of the film have a spacing therebetween.

11. The display according to claim 1, wherein the bending section extends from the second bonding section to the first bonding section along a first direction, the at least one third groove extends along a second direction, and the second direction is perpendicular to the first direction.

12. The display according to claim 1, wherein the bending section extends from the second bonding section to the first bonding section along a first direction, the bending section comprises a first sub-section and a second sub-section, the first sub-section is connected between the second bonding section and the second sub-section, and a width of the second sub-section along a second direction perpendicular to the first direction is greater than a width of the first subsection along the second direction.

13. The display according to claim 1, wherein the adhesive layer is disposed on the end surface.

14. The display according to claim 13, wherein a volume of the adhesive layer is 50% to 70% of a volume of a fillable space between the flexible carrier film and the carrying main body.

15. The display according to claim 1, wherein the carrying main body has a convex part extending from the end surface, at least a part of the convex part is located in the depressed space, and the adhesive layer is disposed on the convex part.

16. The display according to claim 15, wherein the bending section extends from the second bonding section to the first bonding section along a first direction, the inner surface forms a concave surface at the bending section, a radius of curvature of the concave surface is R, and an length of extension of the adhesive layer along the first direction is greater than or equal to $\pi R/2$.

17. The display according to claim 1, wherein the flexible carrier film has at least one perforation at the bending section.

18. A display, comprising:
a carrying main body;
a flexible carrier film, comprising a first bonding section, a second bonding section, and a bending section, wherein the first bonding section and the second bonding section are respectively disposed on two opposite sides of the carrying main body, the bending section is connected between the first bonding section and the second bonding section, the flexible carrier film has an inner surface and an outer surface opposite to each other, the inner surface has at least one first groove at the bending section, the flexible carrier film has a display layer thereon, and at least a part of the display layer is connected to the outer surface at the second bonding section;
a double-sided tape, disposed between the first bonding section and the carrying main body; and
an adhesive layer, disposed between the inner surface and the carrying main body at the bending section, wherein the carrying main body has an end surface, the end surface faces the bending section and is not located in a depressed space formed by the bending section, and at least part of the adhesive layer is located between the end surface and the bending section,
wherein the adhesive layer is disposed on the end surface, and a volume of the adhesive layer is 50% to 70% of a volume of a fellable space between the flexible carrier film and the carrying main body.

* * * * *